United States Patent
Ma et al.

(10) Patent No.: US 6,167,615 B1
(45) Date of Patent: Jan. 2, 2001

(54) METHOD FOR PRODUCING CIRCUIT BOARD ASSEMBLIES USING SURFACE MOUNT COMPONENTS WITH FINELY SPACED LEADS

(75) Inventors: Bao-Tong Ma, Hong Kong (HK); Amit Kumar Sarkhel, Endicott, NY (US); Ping Kwong Seto, Madison, AL (US)

(73) Assignee: International Business Machines Corporation, Armonk, NY (US)

(*) Notice: Under 35 U.S.C. 154(b), the term of this patent shall be extended for 0 days.

(21) Appl. No.: 09/056,101

(22) Filed: Apr. 6, 1998

Related U.S. Application Data

(62) Division of application No. 08/627,806, filed on Apr. 10, 1996, now Pat. No. 5,742,483.

(51) Int. Cl.[7] .................................................. H05K 3/34
(52) U.S. Cl. ...................... 29/840; 228/105; 228/180.22; 228/248.1
(58) Field of Search ................ 29/840, 843; 228/180.2, 228/248; 361/777, 779, 760

(56) References Cited

U.S. PATENT DOCUMENTS

| | | | |
|---|---|---|---|
| 4,733,813 | * | 3/1988 | Le Maeu et al. ..................... 228/1.1 |
| 4,872,261 | * | 10/1989 | Sanyal et al. ......................... 29/840 |
| 5,346,118 | * | 9/1994 | Degani et al. ................. 228/180.22 |
| 5,509,597 | * | 4/1996 | Laferriere ............................. 228/105 |
| 5,523,920 | * | 6/1996 | Machuga et al. .................... 361/760 |

\* cited by examiner

*Primary Examiner*—Lee Young
*Assistant Examiner*—Sean Smith
(74) *Attorney, Agent, or Firm*—John R. Pivnichny

(57) ABSTRACT

Where an electrical connection is needed between an electric circuit on a substrate and a component with very finely spaced leads, pads are formed on the substrate at points where such connections to the circuit are to be made. A solder paste is deposited using a particular, described stencil having a thickness and apertures with specific tolerances. The component is positioned so that its leads to be attached are contiguous with corresponding pads, and the electrical connections are completed by reflowing the solder paste forming consistent and reliable electrical joints of solder alloy.

2 Claims, 9 Drawing Sheets

150

152

154

METHOD FOR PRODUCING CIRCUIT BOARD ASSEMBLIES USING SURFACE MOUNT COMPONENTS WITH FINELY SPACED LEADS

This is a Division of Ser. No. 08/627,806 filed on Apr. 10, 1996 now U.S. Pat. No. 5,742,483.

BACKGROUND OF THE INVENTION

1. Field of the Invention

The present invention, generally, relates to a method for producing circuit board assemblies with very fine pitch leads of surface mount components connected to pads on the circuit board and, more particularly, to pad geometry, solder volumes used in such circuit board assemblies, and stencil geometry used to supply solder paste.

2. Background

Recently in the manufacture of circuit boards and cards, the making of electrical connections between chip carriers and circuit board substrates has encountered problems, and solutions have been evasive.

The increasingly fine pitch of component leads is causing a corresponding increase in the number of open circuit defects found during test of the circuit boards. Investigations indicate that the cause is from a failure of some leads to become connected, that is, some leads do not make contact with the solder on some of the pads.

The planarity of the attachment site and the relative planarity of the leads must be held to deviations less than the solder paste height or resulting solder metal height on the pads in order to reliably attach leaded surface mount components.

The clearest solution to this problem is to increase the volume of solder on the pads in order to increase the solder height during reflow, but when tried, such increase has produced other problems. It was found that the increase in the solder volume caused a type of defect called "solder bridge", because of the very close spacing between the pads.

On very elongated solder pads, too much solder causes solder bulges which join together to form bridges between the pads. Thus, solder volumes have been kept sufficiently low to prevent any such bulging. Also, the length-to-width ratio of solder pads has been kept low to avoid such bridging.

The use of solder pastes at all has been questioned in the surface mount assembly of fine pitch packages also because of increased demands on post attachment rework requirements to remove solder bridges. However, an increase in the quantity of the solder paste is not the sole cause of solder bridge defects, but rather, the dimensions of the pads are involved also.

This problem does not exist only during the assembly process, but rather, it arises any time when connecting a fine pitch lead with a pad on a circuit card, whether it is during the initial assembly or during re-work.

3. Description of Background Art

U.S. Pat. No. 5,385,290 to Degani granted Jan. 31, 1995, describes a relationship between solder quantity and particle size and suggests an improvement is available through a use of a particular size of solder particles.

U.S. Pat. No. 5,346,118 to Degani et al. granted Sep. 13, 1994, describes a method of forming solder bumps on metal pads using a specific stencil configuration, and suggest that solder bumps thus formed will produce reliable solder joints.

U.S. Pat. No. 5,180,097 to Zenshi granted Jan. 19, 1993, describes a method for mounting a component on a circuit board using strips of solder applied to a group of pads that are arranged to correspond with the leads on a component.

An IBM Technical Disclosure Bulletin, Volume 37, No. 06A dated June, 1994, describes a method of depositing solder paste on circuit cards through the use of stencils with particularly defined apertures for depositing smaller particle size solder pastes.

A Technical Paper, IPC-TP-901, by Morris, dated Sep. 5–7, 1990, entitled "Characterizing Solder-Pastes For The 1990s", describes results of various tests of solder pastes and their relationships with stencils, suggesting a need for better control over the manufacturing process.

U.S. Pat. No. 4,998,342 to Bonnell et al. suggests a process for surface mounting components on a circuit board.

Accordingly, the art identified above is hereby incorporated by reference.

The problem of developing open circuits during the connection of components to a circuit board or card appears to be of increased concern today as fine pitch components evolve into ultra fine pitch components and as the spacing between the pads becomes less and less.

Clearly, what is needed is a new and completely different approach to developing a solution. Such a solution is provided by the present invention, which is described in detail hereinafter.

OBJECTS AND SUMMARY OF THE INVENTION

An important object of the present invention is to provide a new and improved method that provides optimum conditions during assembly of a multi-lead component on a circuit card so that solder paste will close gaps between contact pads on the card and the respective leads on the component.

It is a principal object of the present invention to provide a process of attaching a component to a circuit board that minimizes the creation of an open circuit.

Another object of the present invention is to provide a method of attaching a component to a circuit board that minimizes the development of short circuits.

Briefly, the method of the invention includes the steps of forming a pad on a substrate at a point where an electrical connection is needed between an electric circuit of the card and a lead of an electronic component or module. Then, a preselected solder paste is deposited through a stencil formed of a predetermined thickness with apertures formed with specific, tight tolerances in order to achieve consistent and reliable results. Then the device that is to be connected is positioned so that the lead that is to be attached is located contiguous with the pad, and an electrical connection is completed by reflowing the solder paste to form a joint of solder alloy.

Other features, objects and advantages of the present invention will become more readily apparent from the following detailed description of the presently preferred embodiment.

BRIEF DESCRIPTION OF THE DRAWINGS

FIG. 1, which includes

FIG. 3, including

DETAILED DESCRIPTION OF THE INVENTION

Figure 1A:
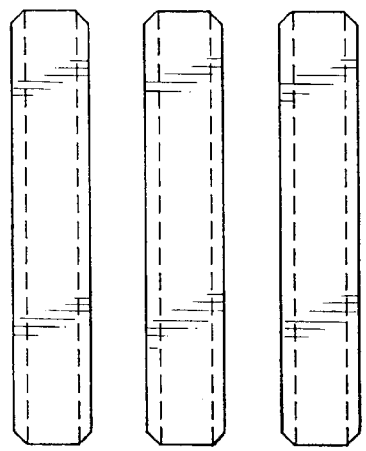
FIG. 1a, FIG. 1b and FIG. 1c, illustrates elongated solder pads.

When solder paste on an elongated pad is reflowed in the absence of a lead from a device or component and the volume of molten solder is sufficient, the solder metal will form a visible bulge that is raised above the surrounding molten solder level by as much as 0.0025 inch (0.063 mm) on a contact pad.

It has been discovered that when certain, quite specific solder metal volume requirements are met, not only will the formation of these solder bulges be ensured, but the plague of open solder joints will be reduced substantially and solder bridging between adjacent leads is avoided.

In accordance with the present invention, the solder volume is in accordance with the following relationship:

$$\frac{VM}{(W)^2 \times L} = 0.3 \text{ to } 0.5$$

where:

VM=Volume in cubic mm of solder metal alloy,

W=Width in mm of contact pad, and

L=Length in mm of contact pad.

Preferably, the width (W) of contact pads should be smaller than industry standard guidelines to avoid bridging. As indicated by the above relationship, the required solder volume increases inversely to the width squared of the contact pad. A reduced contact pad width (W) causes the solder alloy to be confined within a narrower space, which tends to cause a relatively higher solder bulge to form during reflow.

The above identified relationship was developed specifically for a solder of eutectic Pb/Sn. For other solder alloys, similar relations can be developed following the principles of the present invention. Surface mount attachment is accomplished normally by depositing solder paste on pads through a planar metal mask or stencil. The solder paste is a mixture of metal particles, organic vehicles and flux. Solder pastes used for SMT usually contain about 50% metal by volume or 90% metal by weight, such as Kester R244.

The following is the relationship for the volume of solder paste for the 50% metal-by-volume:

$$\frac{VP}{(W)^2 \times L} = 0.6 \text{ to } 1.0$$

Where:

VP=Volume in cubic mm of solder paste.

W=Width in mm of contact pad, and

L=Length in mm of contact pad.

To further ensure that the above solder paste volume is obtained, a stencil with specific dimensions must be used. It is important that the solder paste that fills each opening of a stencil will result in deposition of a precise volume on each pad to form a bulge of molten solder on the pad during reflow to contact the corresponding lead and not be excessive to cause bridging short circuits with other pads.

The following table gives example information on dimensions in millimeters (mm) to ensure correct solder paste volume to cause the formation of the solder bumps:

| PITCH | PAD WIDTH | STENCIL THICKNESS | APERTURE WIDTH | |
|-------|-----------|-------------------|------|--------|
|       |           |                   | TOP  | BOTTOM |
| 0.3   | 0.114–0.127 | 0.102 | 0.102 | 0.127 |
| 0.4   | 0.165–0.190 | 0.127 | 0.190 | 0.216 |
| 0.5   | 0.229–0.254 | 0.152 | 0.241 | 0.267 |

Stencil thickness and aperture size should be maintained precisely as indicated above for all components being assembled with circuit cards using the method of the invention. Stencil thicknesses may generally vary by about 0.025 mm and aperture widths by 0.025 mm as long as the final form is experimentally verified to produce bulges without bridging.

Moreover, the apertures should be smooth and tapered to provide a clean solder paste release onto the contact pads of the circuit card to maintain precise deposit volumes. With the small dimensions involved here, non-tapered apertures do not provide a high degree of reliability in solder paste release.

Also, the material of the stencil affects release of paste, and stainless steel is the preferred metal for the stencil surface. The stencil apertures must be kept within tight tolerances and must be smooth and tapered. Therefore, a laser-cut stencil is preferred to achieve the reliability contemplated by the present invention.

While a plastic squeegee, such as one formed of a hard polymer, may work under some circumstances, too frequently they fail to provide sufficiently small volume tolerances because of the relative softness of a non-metallic material in a situation involving the extremely small dimension of stencil apertures. It has been discovered that a metal squeegee for screening solder paste in such fine pitch component assemblies will provide a high degree of reliability.

Figure 1B:
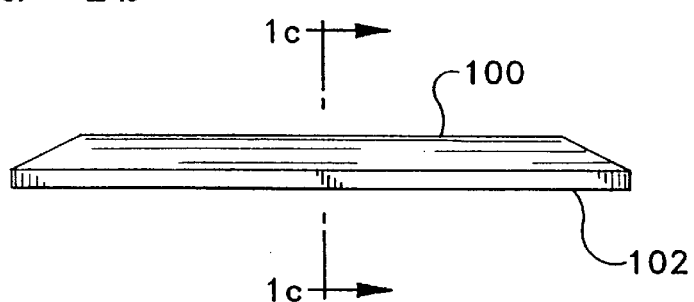
Figure 1C:
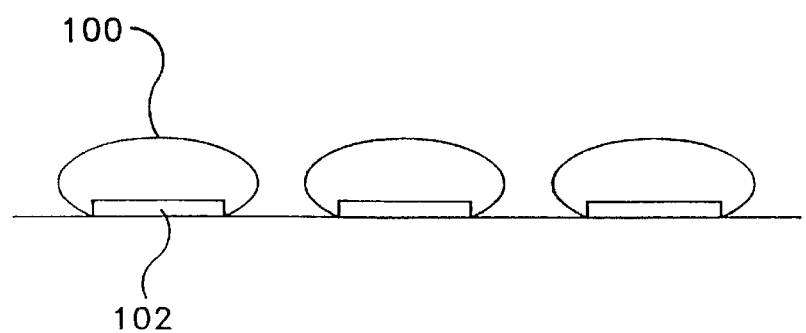

FIG. 1 shows molten eutectic Pb/Sn solder metal 100 on copper pads 102. The pads are sufficiently wide that they do not form bulges.

Figure 2A:
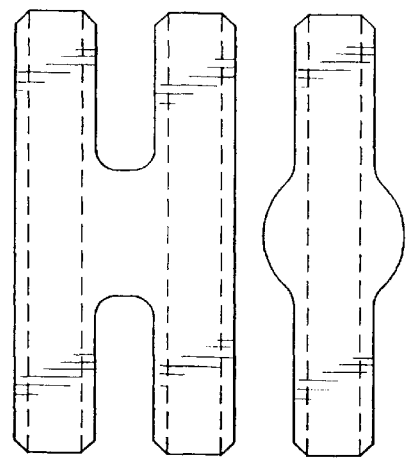
FIG. 2, which includes FIG. 2a, FIG. 2b and FIG. 2c, schematically shows pads that are narrower than the pads that are illustrated in FIG. 1.
Figure 2B:
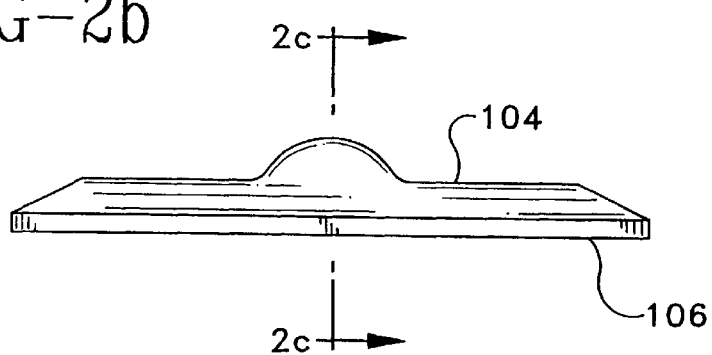
Figure 2C:
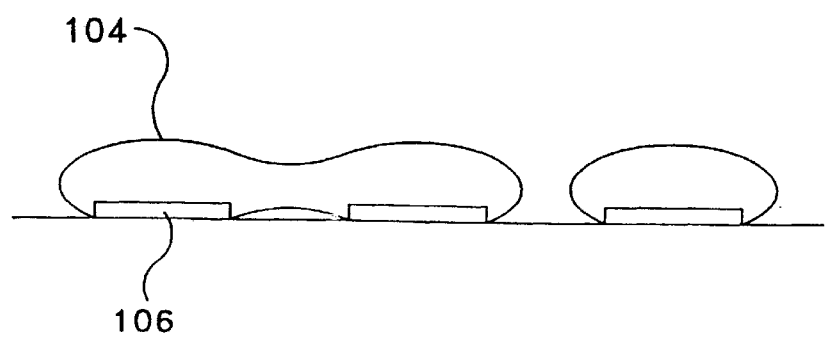

FIG. 2 also shows solder alloy 104 on copper pads 106. In this view, the pads are sufficiently narrow relative to the length of the pads and sufficient solder volume is deposited so that bulges form, but the width is sufficiently high in relation to the pad-to-pad spacing that, as soon as the solder bulges on adjacent pads develops, bridging accurs.

Figure 3A:
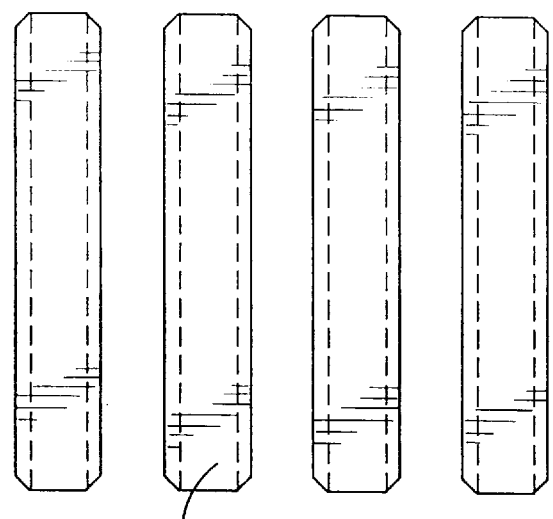
FIG. 3a, FIG. 3b, FIG. 3c and FIG. 3d, illustrates solder pads with different volumes of solder.

FIG. 3 illustrates the solder configuration on the pads of the invention as solder volume increases from FIG. 3a to FIG. 3d. FIG. 3a illustrates a volume of solder 150 that is not sufficient to form bulges, and in FIG. 3b, an embodiment of the invention is illustrated in which the volume of solder 152 is sufficient to form bulges 154 on some of the pads.

Figure 3B:
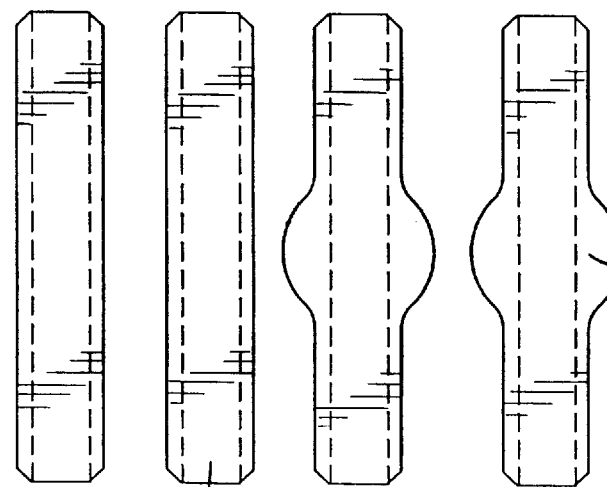

The bulges tend to form somewhere in the middle third of the pad. The pads are sufficiently narrow relative to the pad-to-pad pitch that the bulges which form on adjacent pads do not bridge. In FIG. 3b, the volume is sufficient to significantly reduce the number of opens between the pads and the leads compared to the solder volume shown in FIG. 3a.

Figure 3C:
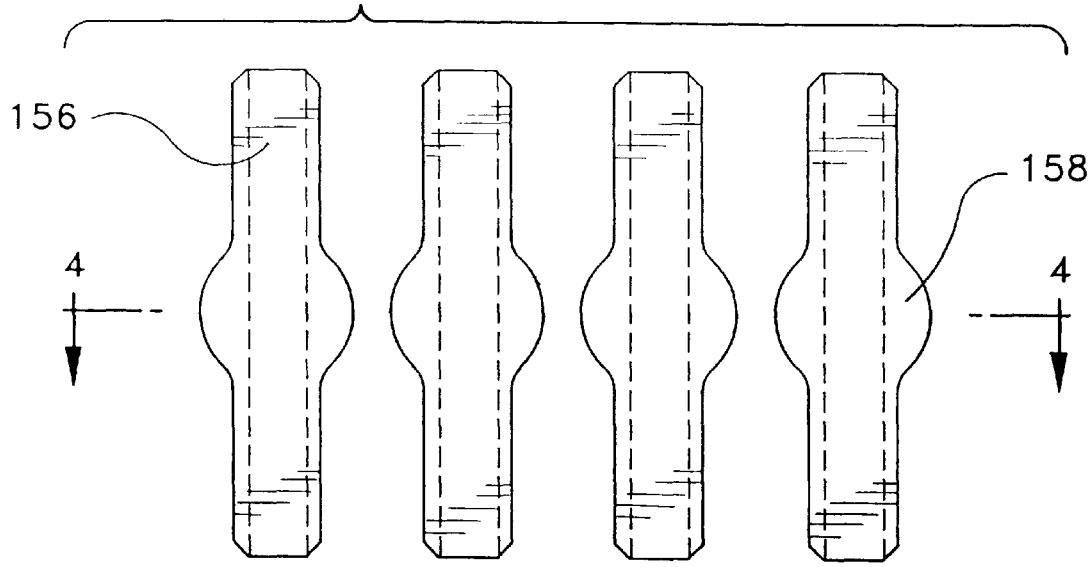

In the solder volume embodiment of the invention of FIG. 3c, the volume of solder 156 is sufficient to form solder bulges 158 on all of the pads, thus minimizing the number of opens. The solder volume embodiment of FIG. 3c is the preferred embodiment.

Preferably, the volume of solder in this embodiment is increased to above that required to form bulges on all pads in order to increase the height of the bulges, preferably enough to produce average bulges of around 0.04 mm above the other solder on the pad.

Figure 3D:
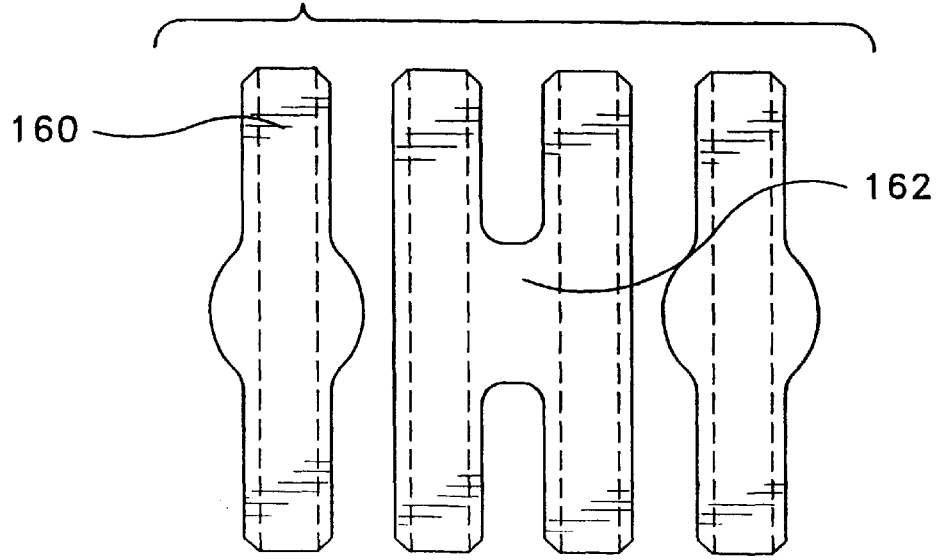

In another embodiment of the invention, the volume of solder 160 in FIG. 3d is higher than the volume in FIG. 3c, and some of the bulges form bridges 162 when there is no lead over the pads. If there are leads over the pads, then molten solder tends to flow onto the leads, and even with the volume of FIG. 3d, bridging will not occur between joints.

The volume of solder which would cause bridging between connection joints is not illustrated, but it would be significantly higher than the volume shown in FIG. 3d.

Figure 4:
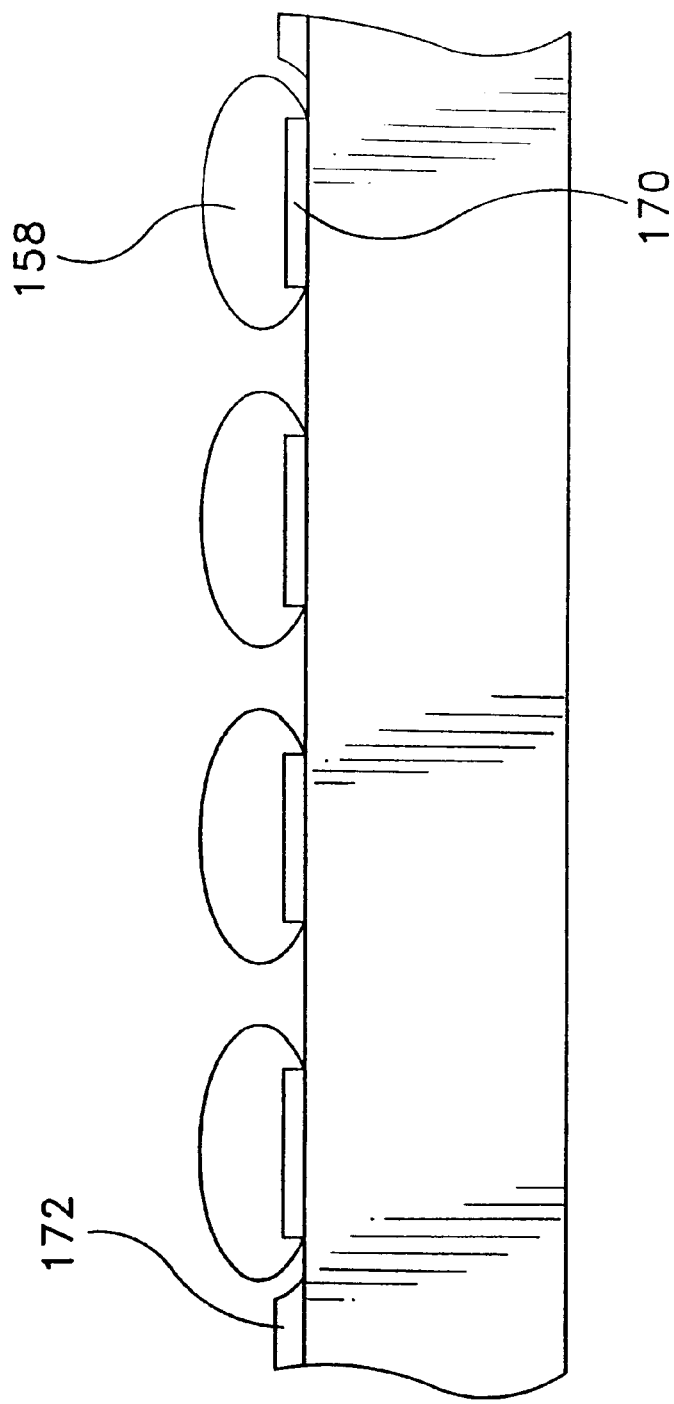
FIG. 4 shows a cross section of the solder pads of the invention with solder bulges.

FIG. 4 illustrates a cross section of the solder pads of FIG. 3c and shows an embodiment of the invention in which pads 170 are sufficiently narrow relative to the pad pitch that solder may bulge without bridging even when there are no leads. Preferably, solder mask 172 extends on the circuit board surface around the rows but not between the individual pads in the rows.

Figure 5:
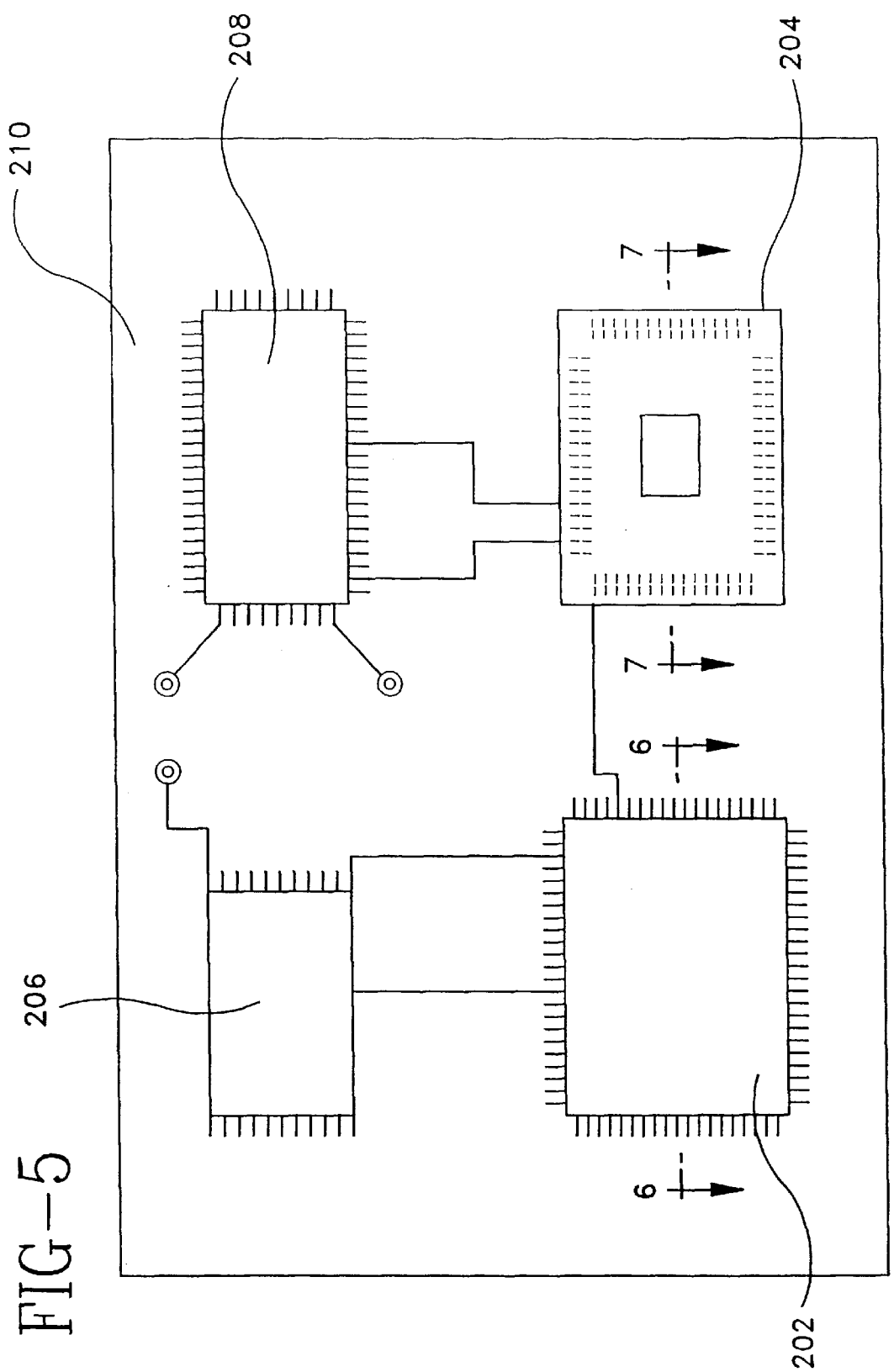
FIG. 5 schematically illustrates an embodiment of the circuit board of the invention.

FIG. 5 illustrates an embodiment of the invention in which a circuit board 200 includes various surface mount components 202, 204, 206 and 208 attached to a circuitized organic substrate 210. The substrate may be a rigid planar substrate of polymer and reinforcing fibers or a flexible substrate of polyimide film and patterned metal film layers. The components are attached to the pads of the invention using the solder volumes of the invention.

Figure 6:
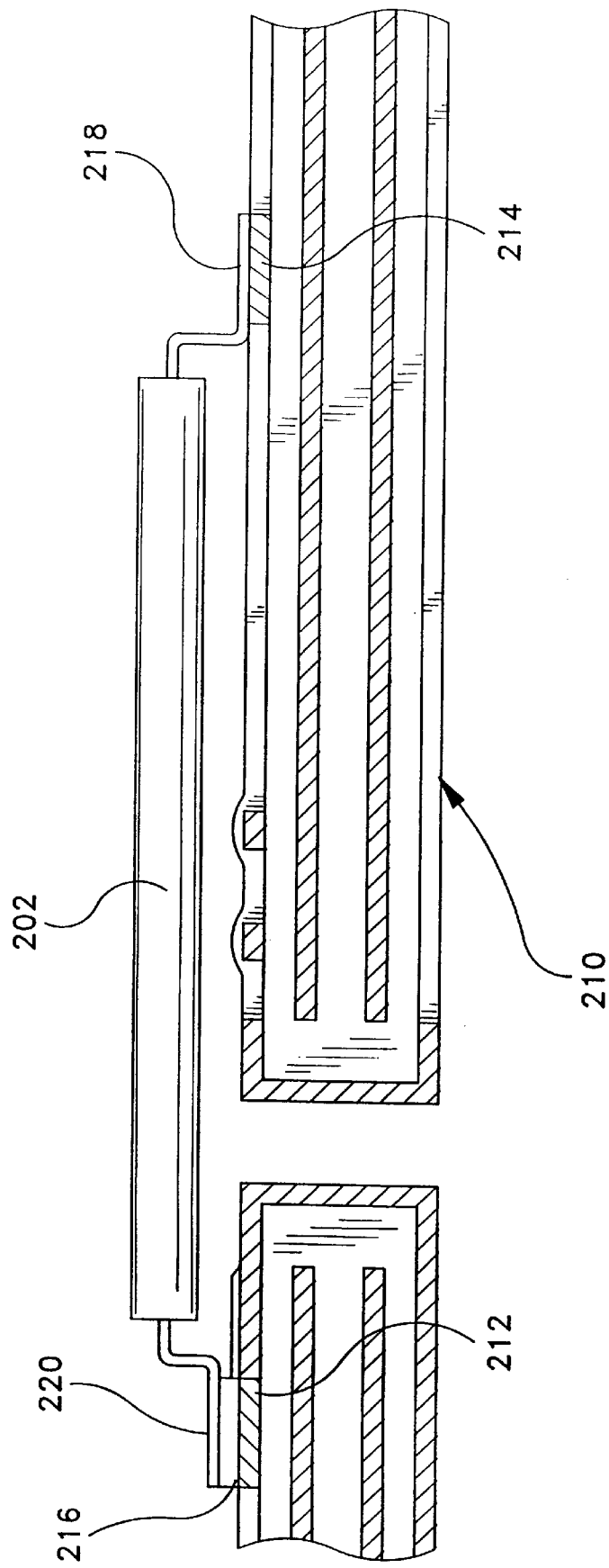
FIG. 6 illustrates a partial cross section of FIG. 5 through a component to be attached, such as a quad flat pack.

FIG. 6 shows attaching a component 202, such as a quad flat pack, to the circuitized substrate 210 using pads 212 and 214 of the invention and solder volumes 216 and 218 of the invention. The advantage of the invention is illustrated by showing the lead portion 220 sufficiently above the level of the lowest leads connecting the component 202 that the solder would not have connected to portion 220 of the lead, if the solder volume of the invention had not been used. Portion 220 of the lead is parallel to the pad and typically shorter (e.g., pad lengths 60–80 mils and lead foot length 20–40 mils).

Figure 7:
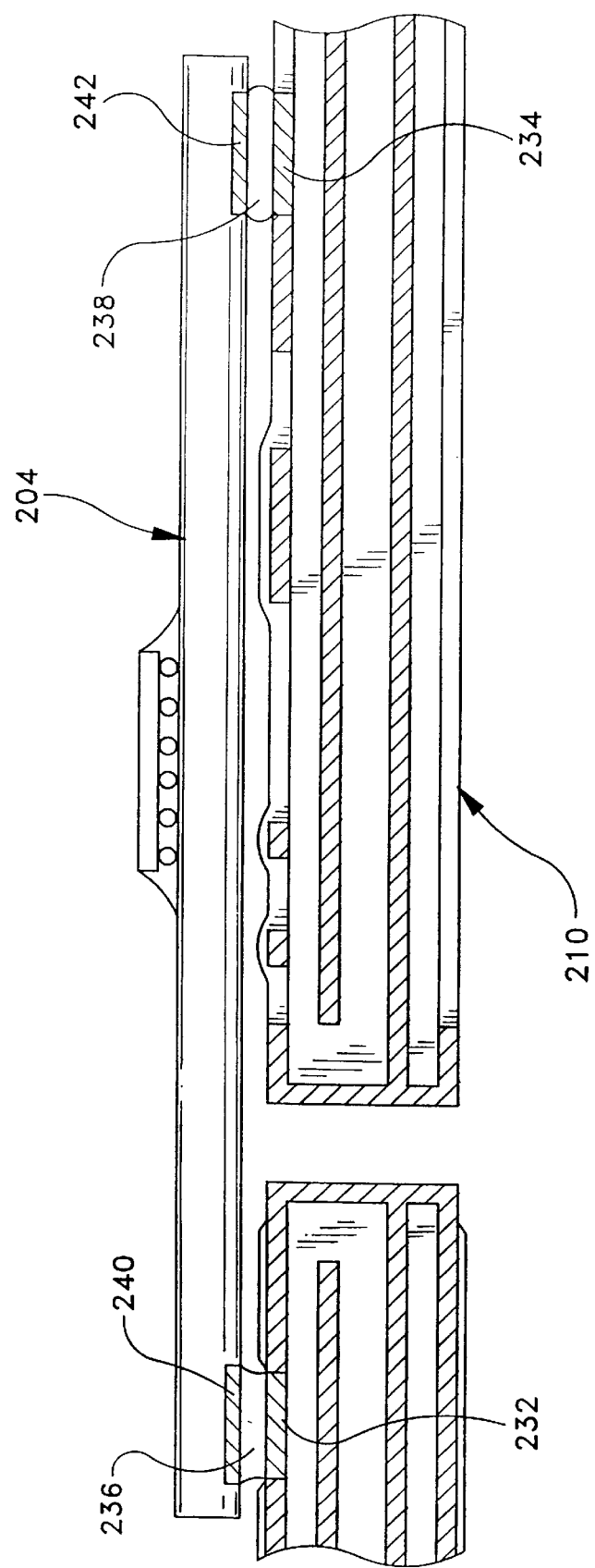
FIG. 7 discloses another partial cross section of FIG. 5 through another component, such as a direct chip attachment module.

FIG. 7 illustrates coupling a component 204, such as a direct chip attachment module (DCAM) to the circuit board substrate 210 using pads 232 and 234 of the invention and solder volumes 236 and 238 of the invention. The leads 240 and 242 of the DCAM are pads on the bottom of the module that typically correspond to the configuration of the circuit board pads for a quad flat pack.

Solder can be deposited on the DCAM pads by plating, contact with a molten solder ware, or by screening into a stencil in addition to or in place of solder on the circuit board. The bumped solder pads of the invention can be either on the DCAM pads or on the circuit board pads.

The advantage of the invention is illustrated by the lead 240 above the level of the lowest other leads connecting the component 204 so that the solder does not connect between the pad 232 and the lead 240 when the solder volume of the invention is not used. Preferably, the lead 240 is a copper pad with the same dimensions as the pad 232.

Alternately for this type of component 204, the solder can be deposited on the leads of the component by screen printing solder paste as described above or by otherwise depositing solder on the leads with the volume of the invention to provide the solder to bulge from the lead and, thus, connect to copper pads 232 and 234 with respective leads 240 and 242.

Figure 8:
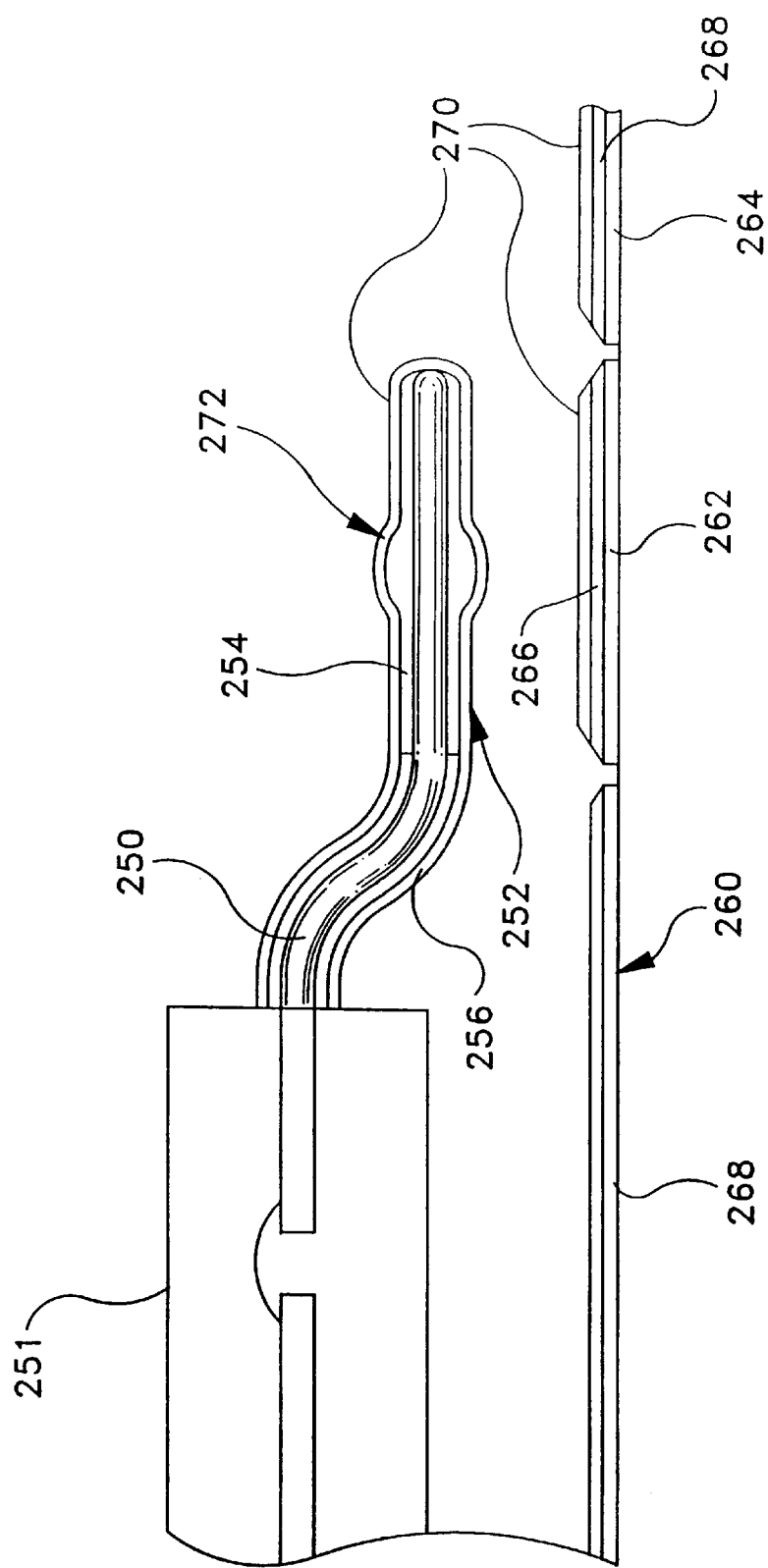
FIG. 8 illustrates a gull-wing lead of a surface mount component to which solder has been applied to form solder bulges.

FIG. 8 shows a specific embodiment of the invention in which a gull wing lead 250 of component 251 has a connection portion or foot 252 onto which solder 254 is deposited. Other portions of the lead can be coated with material 256, such as metal oxide or organic solder mask, which is less wetable by solder than the connection portion of the lead.

The solder can be deposited on the lead by screen printing paste or by plating or by dipping in liquid solder. If screen printed, the paste is reflowed before attachment in order to form a solder alloy.

Wiring layer 258 is deposited on dielectric surface 260 and includes a row of pads 262 and conductors 264 connected to the pads. The pads can be coated with a thin layer of tin, solder or organic protective coating 266.

The conductors and dielectric surface (except between the pads in the row) are coated with solder mask 268 which is highly non-wetting to solder. The pads and/or the leads can be coated with flux 270 for improved solder wetting between the pad and connection portion of the lead. Preferably, the flux is sticky and is a no-clean flux.

When the component is reflowed before placement, the solder metal forms bulges 272. When placed on the pad 262 before reflow, the solder will bulge until it touches the pad and, then, flows between the pad 262 and the lead 250 to form a solder joint leaving no visible bulge.

The invention has been described in substantial detail with reference to the presently preferred embodiment. It will be understood by those skilled in this art that changes and modifications may be made, but all such changes and modifications are within the true spirit and scope of the invention which is defined by the appended claims.

What is claimed is:

1. A method for producing a circuit board assembly having a surface mount component with finely spaced leads, comprising the steps of:

forming a circuit card with a plurality of contact pads in a row for connecting a surface mount component electrically with a circuit of said card, said pads being elongated so that a solder, when molten, forms bulges on the pads;

selecting a solder paste having about 50% metal by volume and wherein the relationship between the volume of said solder paste after application to said pad and the dimensions of said pad on the circuit card is:

$$\frac{VP}{(W)^2 \times L} = 0.6 \text{ to } 1.0$$

where:
VP=Volume (cubic mm) of solder paste,
W=Width (mm) of pad, and
L=Length (mm) of pad;

forming a planar stencil for use in applying said solder paste to said pads, said stencil having a thickness and openings with dimensions and tolerances for providing an amount of the solder paste to each pad to form bulges of molten solder consistently on said pads during reflow when leads are not on said pads, without forming solder bridges between joints;

applying said solder paste through said stencil with a squeegee formed of a hard material while said stencil is kept in contact with said card;

positioning said component on said card with leads in contact with said solder paste;

heating to reflow said solder paste to form molten solder alloy which would bulge to reach up to contact any lead above said pads that is higher than either the height of said solder paste or the height of said molten solder on said pads;

cooling to form solid joints of solder alloy between respective leads and pads.

2. The method according to claim 1, wherein the method further comprising:

selecting a stencil thickness and aperture dimensions to provide said solder metal volume in accordance with the relationship:

$$\frac{VM}{(W)^2 \times L} = 0.3 \text{ to } 0.5$$

where:

VM=Volume (cubic mm) of solder metal,

W=Width of each pad in mm,

L=Length of each pad in mm;

said fine pitch between said leads being limited to a center-to-center range of 0.3 to 0.5 mm; and said stencil dimensions including a thickness limited to a range of 0.10–0.15 mm in thickness, and apertures with dimensions of 0.102–0.241 mm at the top and tapered at an angle of at least 4 degrees to provide a larger bottom opening, positioning said stencil adjacent said surface;

applying said solder paste through said aperture with said squeegee;

positioning said component on said surface with said leads in contact with said paste; and heating said solder paste to form molten solder alloy to contact said leads with said matching contact pads.

\* \* \* \* \*